United States Patent
Wu et al.

[11] Patent Number: 6,055,286
[45] Date of Patent: Apr. 25, 2000

[54] OVERSAMPLING ROTATIONAL FREQUENCY DETECTOR

[75] Inventors: Bin Wu, San Jose; Richard C Walker, Palo Alto, both of Calif.

[73] Assignee: Hewlett-Packard Company, Palo Alto, Calif.

[21] Appl. No.: 08/885,368

[22] Filed: Jul. 1, 1997

[51] Int. Cl.[7] .................................................. H03D 3/24

[52] U.S. Cl. .......................... 375/375; 375/374; 375/376; 331/1 A; 331/25

[58] Field of Search ...................................... 375/375, 376, 375/374; 331/1 A, 25

[56] References Cited

U.S. PATENT DOCUMENTS

| | | | |
|---|---|---|---|
| 4,308,505 | 12/1981 | Messerschmitt | 331/25 |
| 4,587,496 | 5/1986 | Wolaver | 331/1 A |
| 4,594,564 | 6/1986 | Yarborough, Jr. | 331/1 A |
| 4,803,705 | 2/1989 | Gillingham et al. | 375/375 |

*Primary Examiner*—Stephen Chin
*Assistant Examiner*—Shuwang Liu
*Attorney, Agent, or Firm*—Pamela Lau Kee

[57] ABSTRACT

This invention provides a simple yet robust solution to the phase-locked loop frequency acquisition problem in clock and data recovery circuits by using a frequency detector with a deadband, which is constructed in part with an oversampling rotational frequency detector.

10 Claims, 10 Drawing Sheets

| SAMPLING CLK STATE | SAMPLED RAW VECTOR,(a,b) | PROCESSING | PROCESSED VECTOR,(a',b') |
|---|---|---|---|
| CD 00 | 00<br>01<br>11<br>10 | ROTATE CLOCKWISE BY 0 DEGREE | 00<br>01<br>11<br>10 |
| 01 | 00<br>01<br>11<br>10 | ROTATE CLOCKWISE BY 90 DEGREE | 10<br>00<br>01<br>11 |
| 11 | 00<br>01<br>11<br>10 | ROTATE CLOCKWISE BY 180 DEGREE | 11<br>10<br>00<br>01 |
| 10 | 00<br>01<br>11<br>10 | ROTATE CLOCKWISE BY 270 DEGREE | 01<br>11<br>10<br>00 |

OVERSAMPLING ROTATIONAL FREQUENCY DETECTOR

FIELD OF THE INVENTION

The invention is directed towards data communication and telecommunication applications. In particular, the invention is directed towards phased-locked loops used in these applications.

BACKGROUND OF THE INVENTION

Phase locked loops (PLLs) are used in data communication and telecommunication applications to lock onto the frequency of a signal. The capture range of a PLL is typically narrow. Therefore, a frequency acquisition aid is usually needed in clock and data recovery (CDR) circuits. Walker, et al. in "A 1.5 Gigabit/s link interface chipset for computer data transmission", IEEE J. Selected Areas Communication, disclosed a technique using special training data sequences. The transmit side sends special training sequences (clock-like signals) during receiver frequency/phase acquisition stage. The disadvantage is that the training sequences are not always available for all applications.

Another prior art method uses frequency detectors (FDs) that operate on the input data, and the I and Q output of the voltage-controlled oscillator (VCO). These FDs mostly can be categorized into two types: quadricorrelator and rotational frequency detector. The quadricorrelator may either be analog or digital while a rotational frequency detector is digital. An analog quadricorrelator requires many special analog components, including rectifier, differentiator, etc., as disclosed by Gardner in "Properties of Frequency Difference Detectors", IEEE Trans. Comm. It is difficult to implement and when not carefully designed, may not function properly under all conditions. The digital implementations, such as that disclosed by Pottbacker, et al. "A Si Bipolar Phase and Frequency Detector IC for Clock Extraction up to 8 Gigabit/s", IEEE Journal of Solid State Circuits or Messerschmitt, et al. in "Frequency Detectors for PLL Acquisition in Timing and Carrier Recovery", IEEE Trans. Comm., have at most +/− 50% usable frequency range, but are often narrower depending on the implementation and the statistics of the input data. Due to process, temperature and VCC variations, many integrated VCOs have an upper frequency range that is more than twice, and a lower end that is less than ½ of their nominal frequency. Therefore these digital implementations are not adequate in this respect. Furthermore, they are also susceptible to erroneous out-of-lock indications due to jitter on the input data or isolated bit errors.

Other prior art solutions use a local reference clock. The VCO is made to frequency lock to this reference. This method is robust because it does not rely on the input data stream. Two variations are common. In the first, an externally supplied lock-to-reference control signal causes the PLL to lock to the reference clock exclusively. Having achieved frequency lock, the PLL phase locks to the data when the control is deasserted. The disadvantage is that the users must provide an extra control signal, which is not always convenient. In the second variation, a lock detector provides an automatic lock-to-reference control. The lock detector asserts this control signal when it thinks the PLL is out of lock. This lock detector operates on the input data and VCO output, similar to the frequency detector methods. This lock detector therefore has similar problems, including narrow usable frequency range, susceptibility to erroneous out-of-lock indication due to jitter on the input data or isolated bit-error events.

SUMMARY OF THE INVENTION

This invention provides a simple yet robust solution to the PLL frequency acquisition problem in clock and data recovery (CDR) circuits, when a local frequency reference signal is available. The frequency detector has a narrow deadband around its nominal frequency. This deadband allows for possible mismatch between the data rate and the local reference frequencies, yet the width of this deadband is still narrower than the capture range of the phase lock loop. A crucial element used to construct such a frequency detector is an oversampling rotational frequency detector. Compared with a standard rotational frequency detector, the oversampling version provides a much wider usable frequency range to cover the wide variations of the typical integrated voltage controlled oscillators.

DETAILED DESCRIPTION OF THE DRAWINGS

Figure 1:
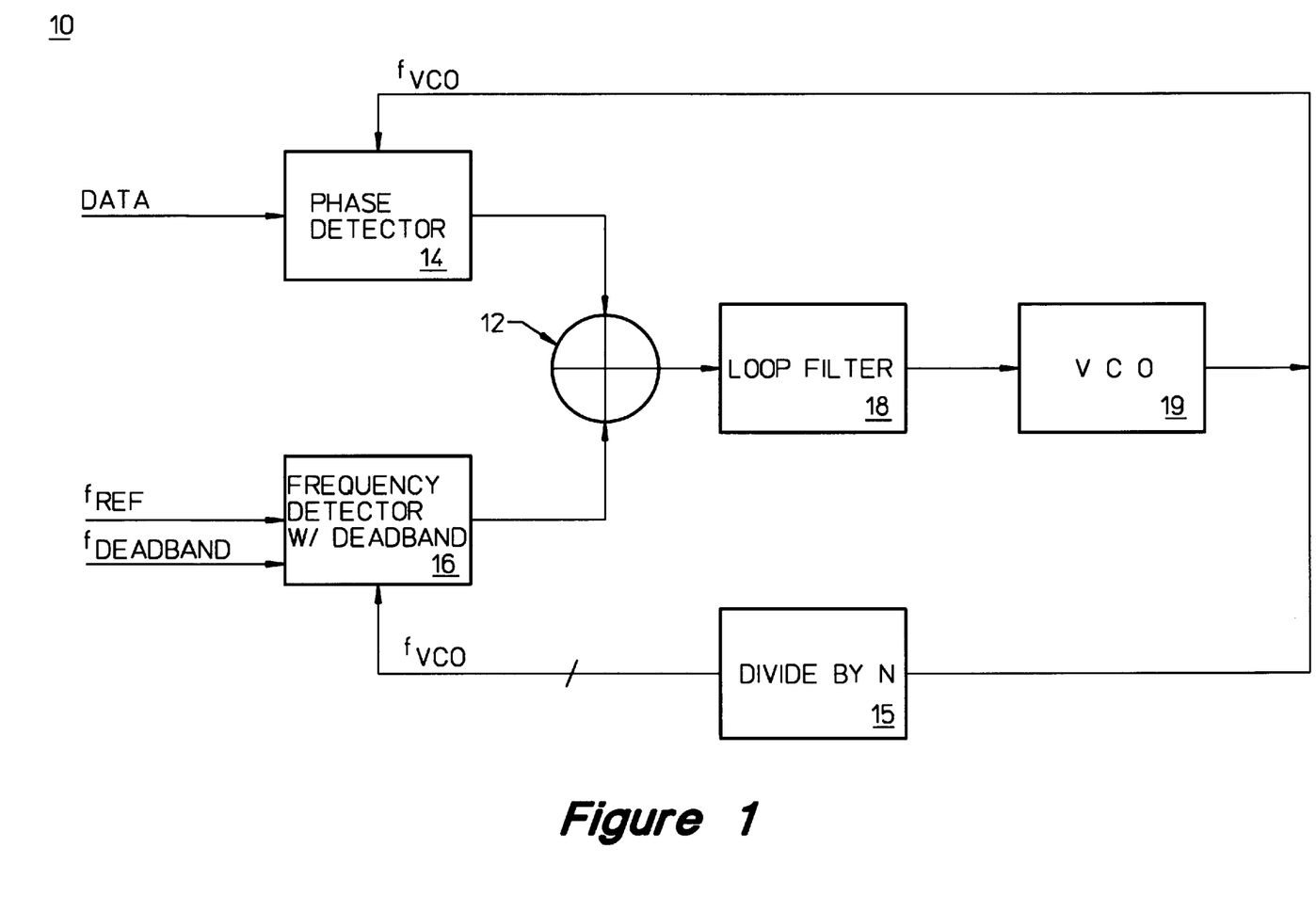
FIG. 1 illustrates a phase-locked loop of the present invention.

FIG. 1 illustrates a block diagram of a phase-locked loop (PLL) 10 of the present invention. An adder 12 receives, as inputs, the outputs from a phase detector 14 and a frequency detector 16. The output of the adder 12 is connected to a loop filter 18. An input of a voltage controlled oscillator (VCO) 19 is connected to the loop filter 18 while the output is connected to the phase detector 14 and a divider 15. The divider 15 is further connected to the frequency detector 16. The phase detector 14 receives data as an input signal. The frequency detector 16 receives two clock signals $f_{REF}$ and $f_{deadband}$.

Figure 2:
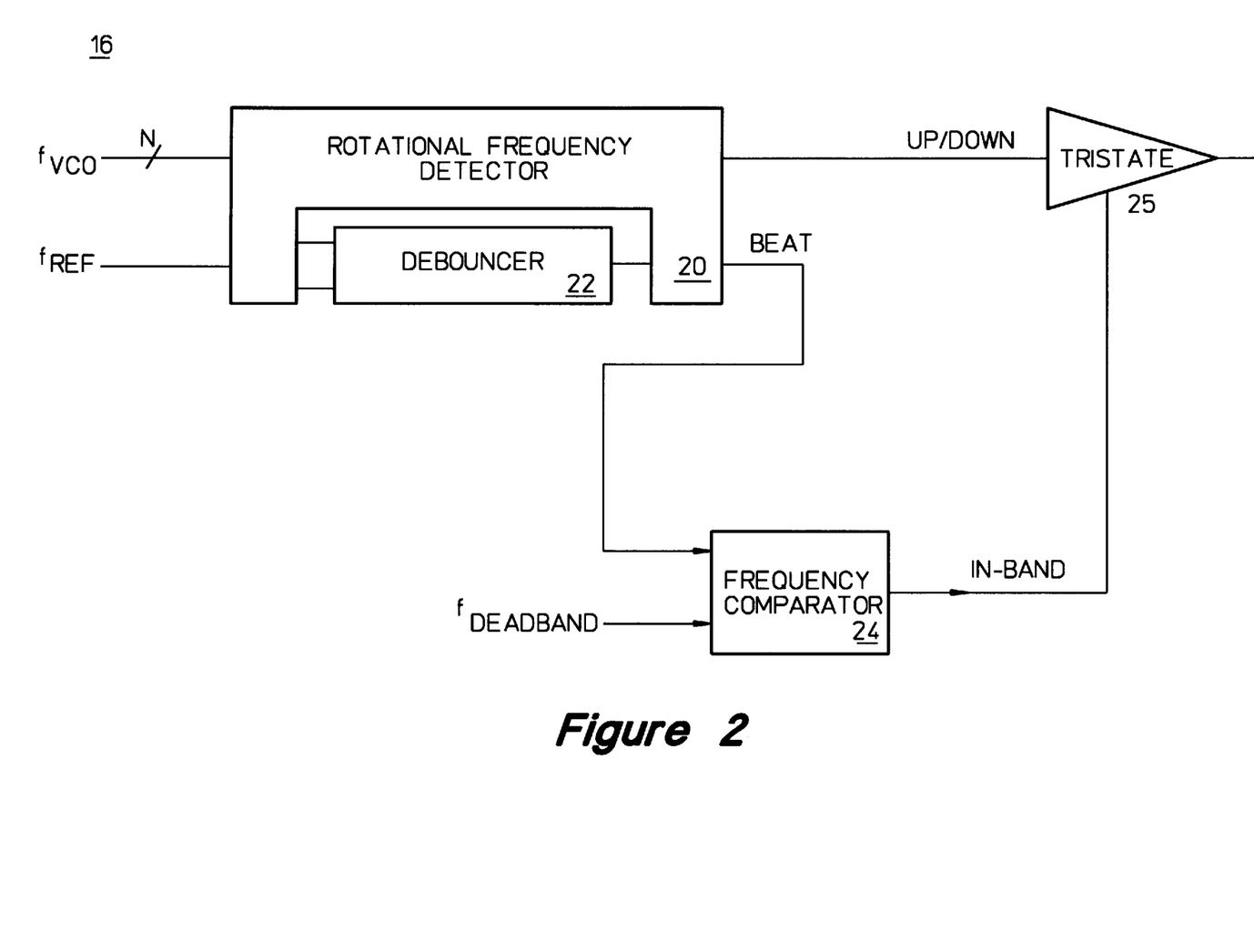
FIG. 2 is a block diagram for the frequency detector with deadband shown in FIG. 1.

FIG. 2 illustrates a block diagram for the frequency detector with deadband 16 illustrated in FIG. 1. A rotational frequency detector 20, generates an up/down output and beat output, is connected to an optional debouncer circuit 22. The beat output of the frequency detector 20 is connected to one input of a frequency comparator 24. The other input of the comparator 24 is connected to $f_{deadband}$. The up/down output of the frequency detector 20 is enabled/disabled by a tristate or similar device 25 under the control of the in-band output of the frequency comparator 24.

Figure 3A:
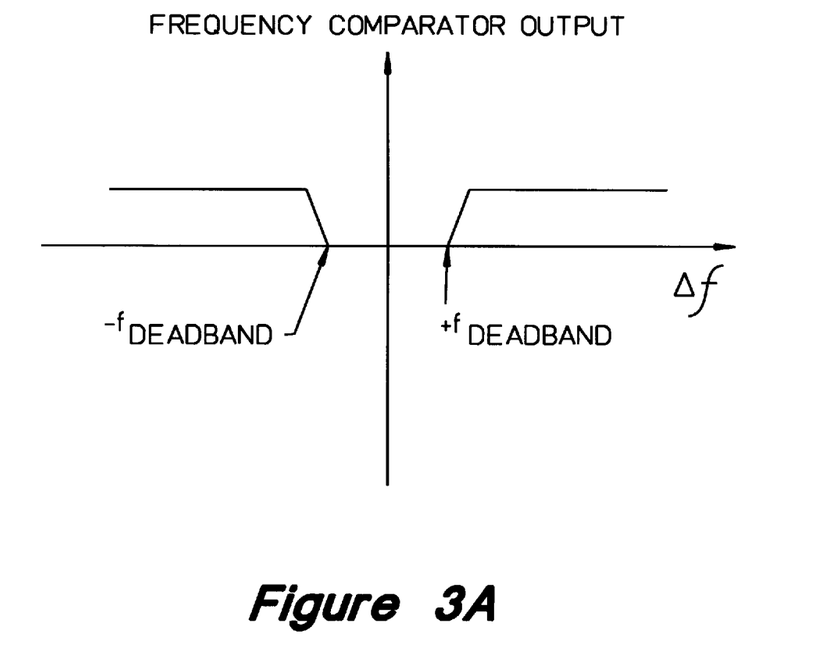
FIGS. 3A–B illustrate the desired frequency characteristic for the frequency detector with deadband shown in FIG. 2.
Figure 3B:
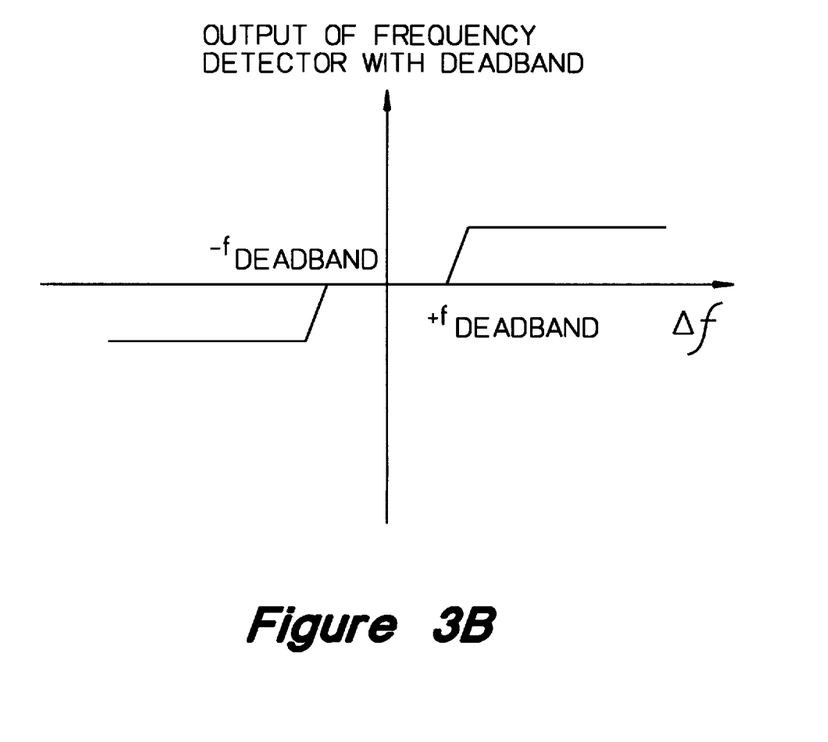

FIGS. 3A–B illustrate the desired characteristics of the frequency detector with deadband 16 shown in FIG. 2. The output is zero when the frequency difference is less than $f_{deadband}$ (e.g. 0.4% of nominal frequency). This deadband is needed because although the local reference clock is very close in frequency to the input data (e.g. within 100 PPM), it is often not frequency locked. This band must be narrower than the pull-in range of the PLL, yet wide enough to allow certain frequency difference between the data rate and local reference clock, and also jitter and wander at the data input.

The output of the frequency detector with deadband saturates rapidly when the frequency difference is larger than $f_{deadband}$. The frequency detector drives the loop with full force when the voltage-controlled oscillator (VCO) is out of band. This ensures that the loop is driven back to within the deadband, even with possible offsets in the loop filter, and possible erroneous output from the phase detector.

The rotational frequency detector compares the output of the VCO with the reference clock, and generates a beat tone at the difference frequency and a logic signal indicating whether the VCO is too fast or too slow. The debouncer takes away the spurious transitions in the beat signal. The frequency comparator compares the beat tone with a known low frequency, which can be produced, for example, by dividing down the reference clock. When the beat tone is slower than this frequency, the output of the frequency comparator is a logic 1, which is used to disable (tristate) the up/down output. After the frequency detector is disabled, the phase detector operates alone to phase lock the VCO to the input data.

Figure 4A:
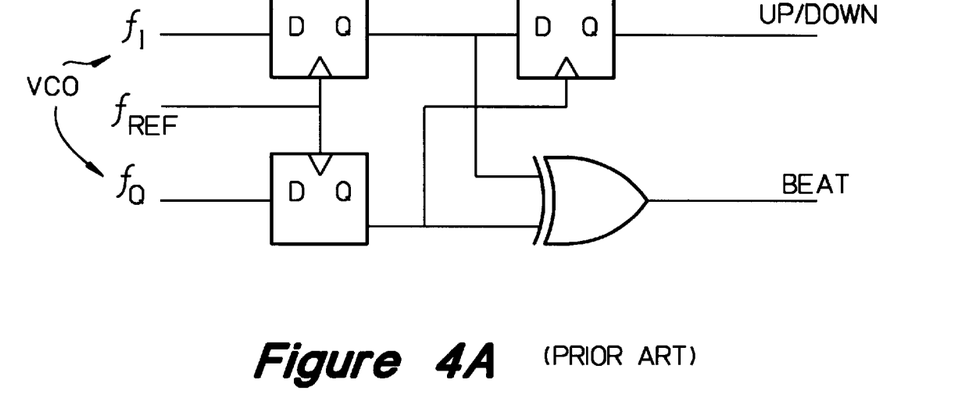
FIGS. 4A–C illustrate a prior art rotational frequency detector.
Figure 4B:
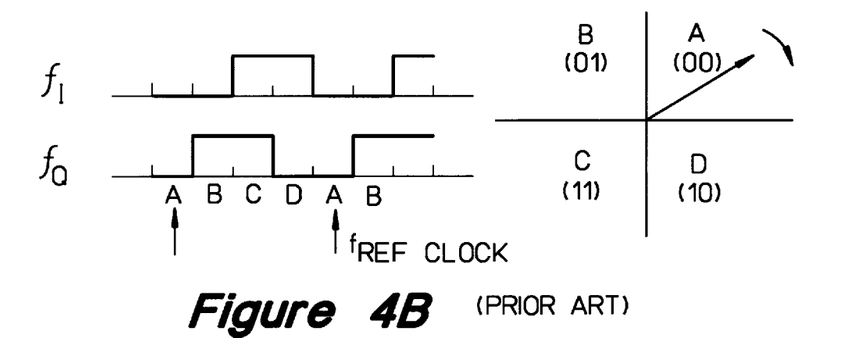
Figure 4C:
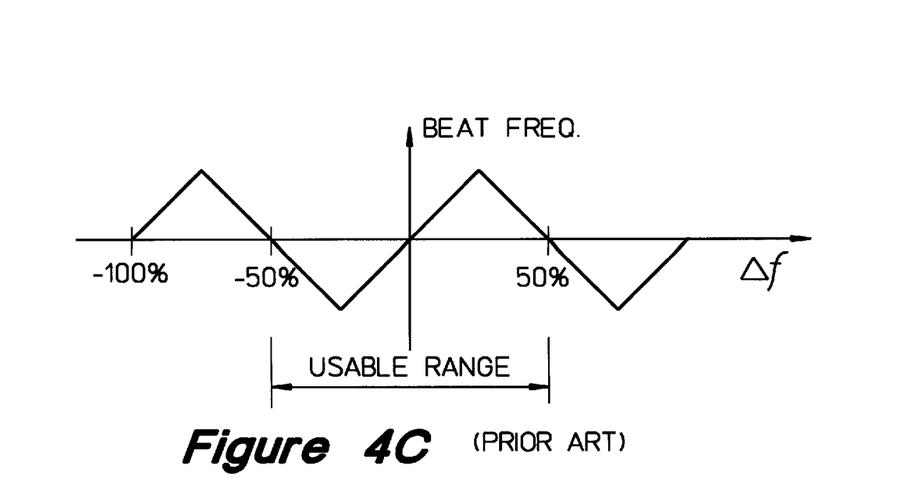

Rotational frequency detectors are well suited for generating a beat tone and an up/down indication. In a prior art rotational frequency detector (shown in FIG. 4A), a clock signal $f_I$ and its quadrature $f_Q$ are sampled by another signal $f_{ref}$ which is nominally at the same frequency. When the two frequencies are exactly the same, the sampled values are static, that is the sampled vector stays at a particular quadrant A, B, C or D (shown in FIG. 4B). When the two frequencies are slightly different, the vector rotates in one direction or another depending on the sign of the frequency difference, which in turn generates the up/down signal and beat tone. However, this device has a maximum usable frequency range of only +/- 50% (shown in FIG. 4C). It is usually not wide enough to cover the frequency variations of an integrated VCO.

Figure 5:
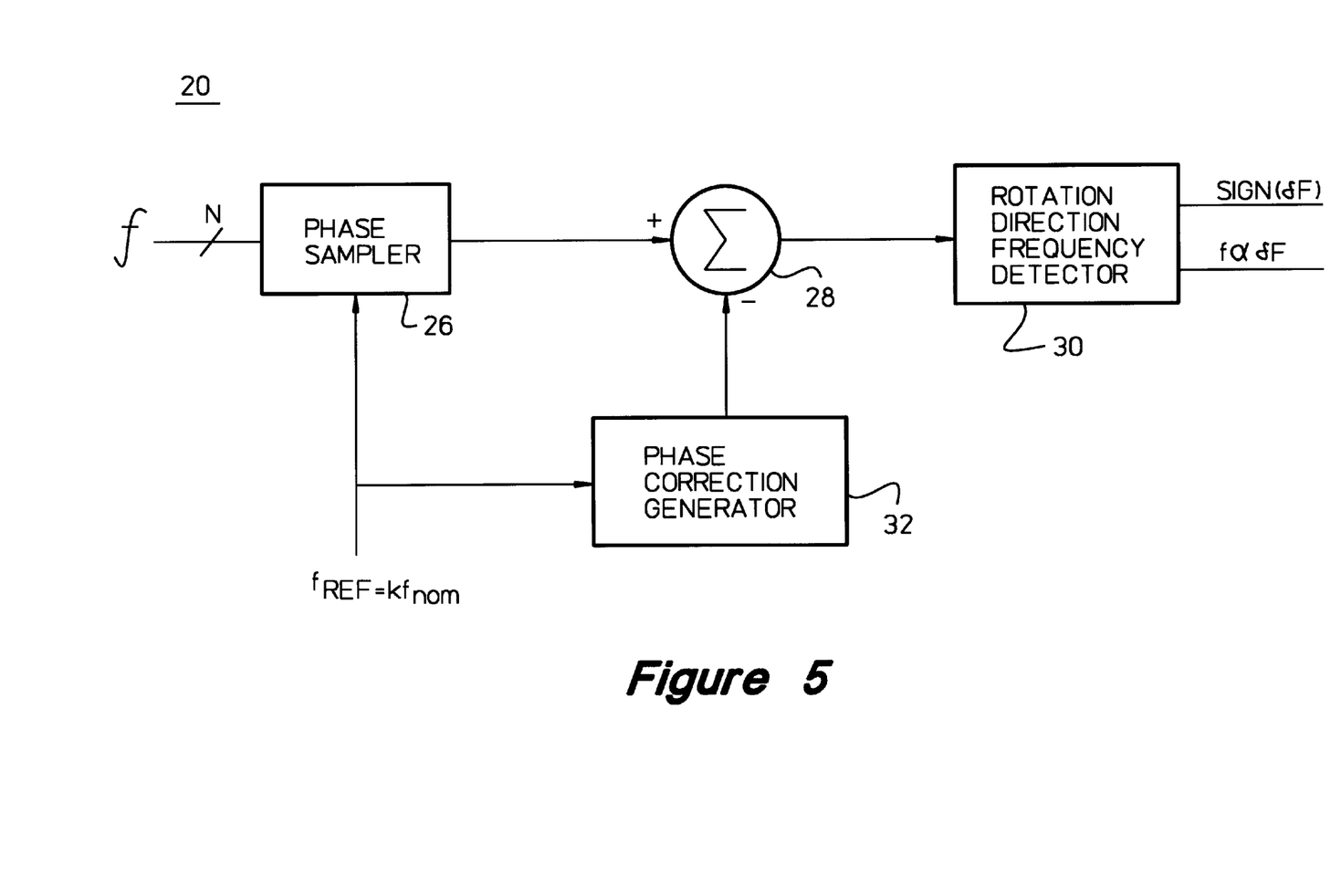
FIG. 5 illustrates a generalized oversampling rotational frequency detector of the present invention.

FIG. 5 illustrates a generalized oversampling rotational frequency detector of the present invention. A phase sampler 26 samples the phase of the input signals. A phase correction generator 32 produces a correctional phase due to oversampling. A subtractor 28 corrects the output of the phase sampler 26. The output of the subtractor connects to a rotation direction/frequency detector block. The output of the block indicates the direction of rotation and the beat frequency.

In operation, the generalized oversampling rotational frequency detector measures the frequency error of a signal, e.g. $f_{vco}$, by sampling it with a reference signal, i.e. $f_{REF}$.

$$f_{VCO} = f_{NOM} + \Delta f(t) \quad (1)$$

$$f_{REF} = k f_{NOM} \quad (2)$$

Since signal $f_{VCO}$ is sampled at a rate of $f_{REF}$, the phase rotation between consecutive samples is:

$$\Delta\theta = \frac{1}{f_{REF}} \times 2\pi \times f_{VCO} = \frac{1}{k f_{NOM}} \times 2\pi (f_{NOM} + \Delta f(t)) \quad (3)$$

$$\Delta\theta = \frac{2\pi}{k} + \frac{2\pi \Delta f(t)}{k f_{NOM}} \quad (4)$$

This rotation consists of two terms:

$$\frac{2\pi \Delta f(t)}{k f_{NOM}}$$

is the desired term corresponding to the $\Delta f(t)$, the frequency error; and $2\pi/k$ is due to the oversampling condition. To correct the phase samples for oversampling by k, the oversampling phase error term $$\frac{2\pi}{k}$$

must be eliminated.

If k=1, then there is no error. If k=2 (double rate), then each sample n, where n is an integer has an error of $\pi n$, or alternating polarity inversion between samples. If k=4 (quad rate), then the phase error of sample n is $$\frac{\pi}{2} n.$$

In the preferred embodiment, when the phase sampler 26 measures binary-quantized I, Q samples, k is limited to 1, 2, or 4. With a more general multi-phase sampler, k is arbitrary. In the general case, the phase correction of sample n is $$\frac{2\pi n}{k} = \theta_{correction}(n) \quad (5)$$

The I and Q samples are adjusted into corrected samples I' and Q' with following formula for vector rotation:

$$I'(n) = \cos(\theta_c(n)) I_n + \sin(\theta_c(n)) Q_n \quad (6)$$

$$Q'(n) = -\sin(\theta_c(n)) I_n + \cos(\theta_c(n)) Q_n \quad (7)$$

When k=2 or 4, the cosine and sine terms simplify to $\cos(n\pi)$ and $\sin(n\pi)$ or $\in(0, 1, -1)$, making for a very simple digital implementation.

Figure 6A:
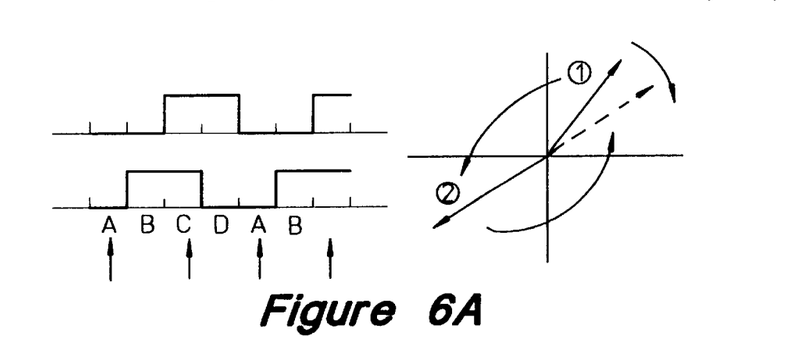
FIGS. 6A–C illustrate a double-rate rotational frequency detector of the present invention.
Figure 6B:
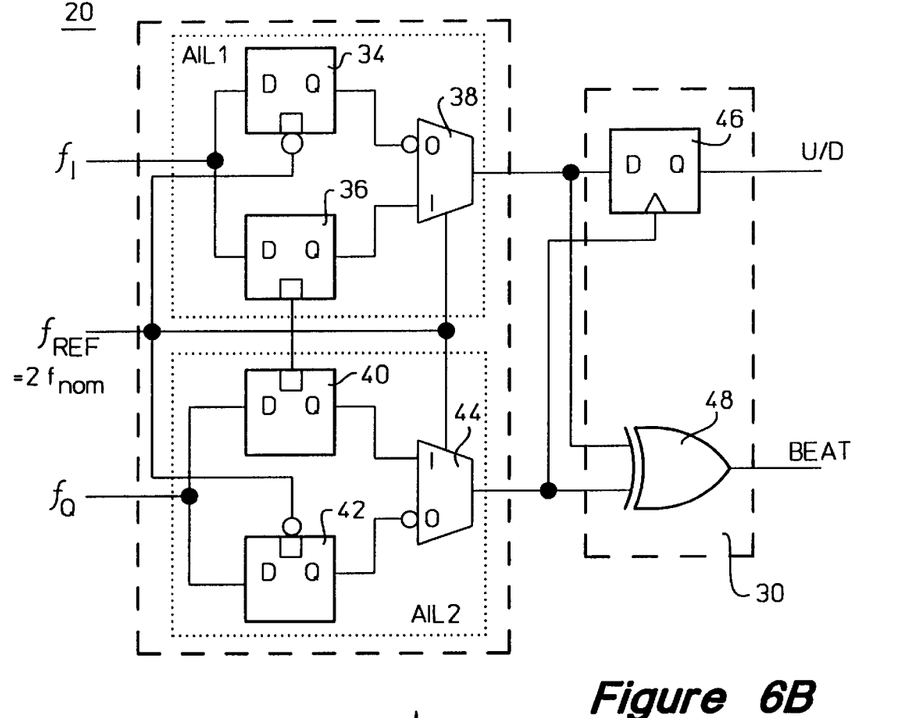
Figure 6C:
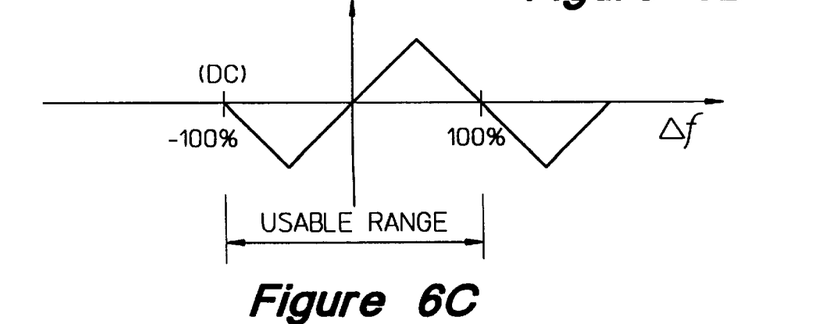

FIGS. 6A–C illustrates a schematic diagram of a double-rate rotational frequency detector 20 that implements the functional block diagram shown in FIG. 5. A first double-edge-triggered alternating inverting latch (AIL) and a second AIL receive a reference signal $f_{REF}$ a clock input. The input signal to the first AIL is $f_I$ while the input signal to the second AIL is $f_Q$. A D-flip-flop 46 is clocked by the output of the second AIL while it receives the output of the first AIL as an input. The output of the flip-flop 46 reflects the sign of the frequency offset. An XOR gate 48 is connected to the outputs of the first and the second AIL. The output of the XOR 48 indicates the beat frequency or the magnitude of frequency offset $\Delta f(t)$. It would be obvious to one of ordinary skill in the art that the generation of the beat signal may be accomplished in a different manner including simply selecting one of the AIL outputs as the beat signal.

Each AIL includes a first D latch 34, 42 and a second D-latch 36, 40. The clock input of the first D-latch 34, 42 is inverted. The inputs of the D-latches 34, 36, 40, 42 are tied together. The inputs for a 2-input selector 38,44 are the negated output of the first D-latch 34, 42 and the output for the second D-latch 36, 40.

When the sampling frequency is twice the nominal rate, we have shown that the sampled vectors exhibit a spurious 180° on alternate samples. These samples may be phase corrected by alternately inverting the sampled vectors. The sense and frequency of the rotation of this phase corrected vector reflects the direction and the frequency difference of the Δf(t). This alternate inversion function is implemented as an integral part of the sampling AIL: this special double-edge-triggered latch sets its output Q to D at the rising edge, of clock, sets Q to D-bar at the falling edge.

The usable range of this double rate detector is doubled to +/− 100%, or from DC to twice the nominal frequency. The beat frequency output vs. frequency offset is plotted in FIG. 6C.

Figure 7A:
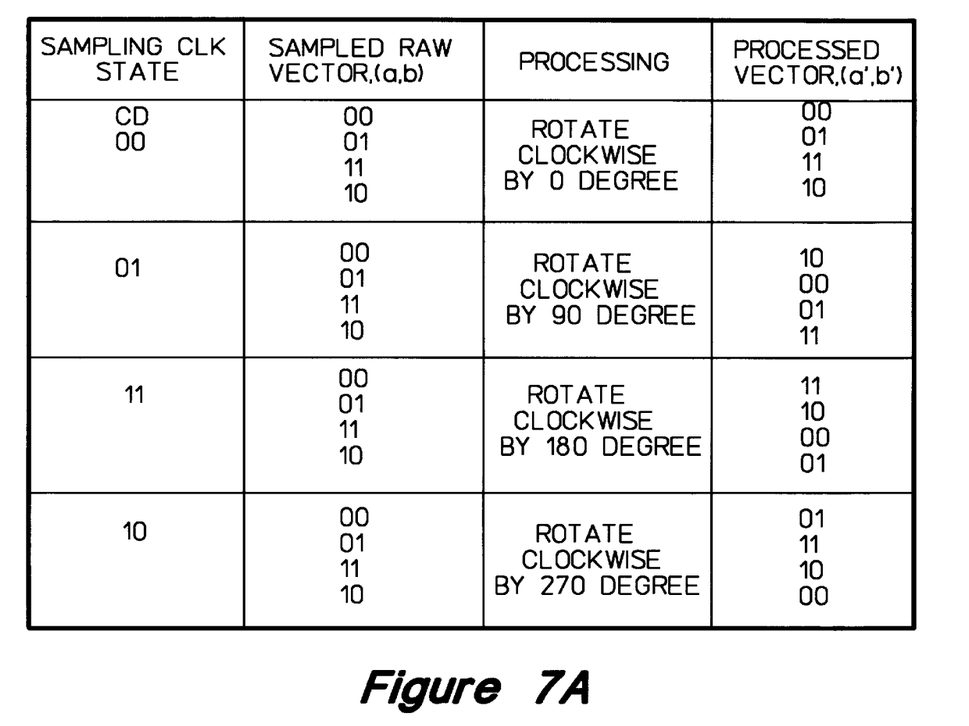
FIGS. 7A–C illustrate a quad-rate rotational frequency detector of the present invention.
Figure 7B:
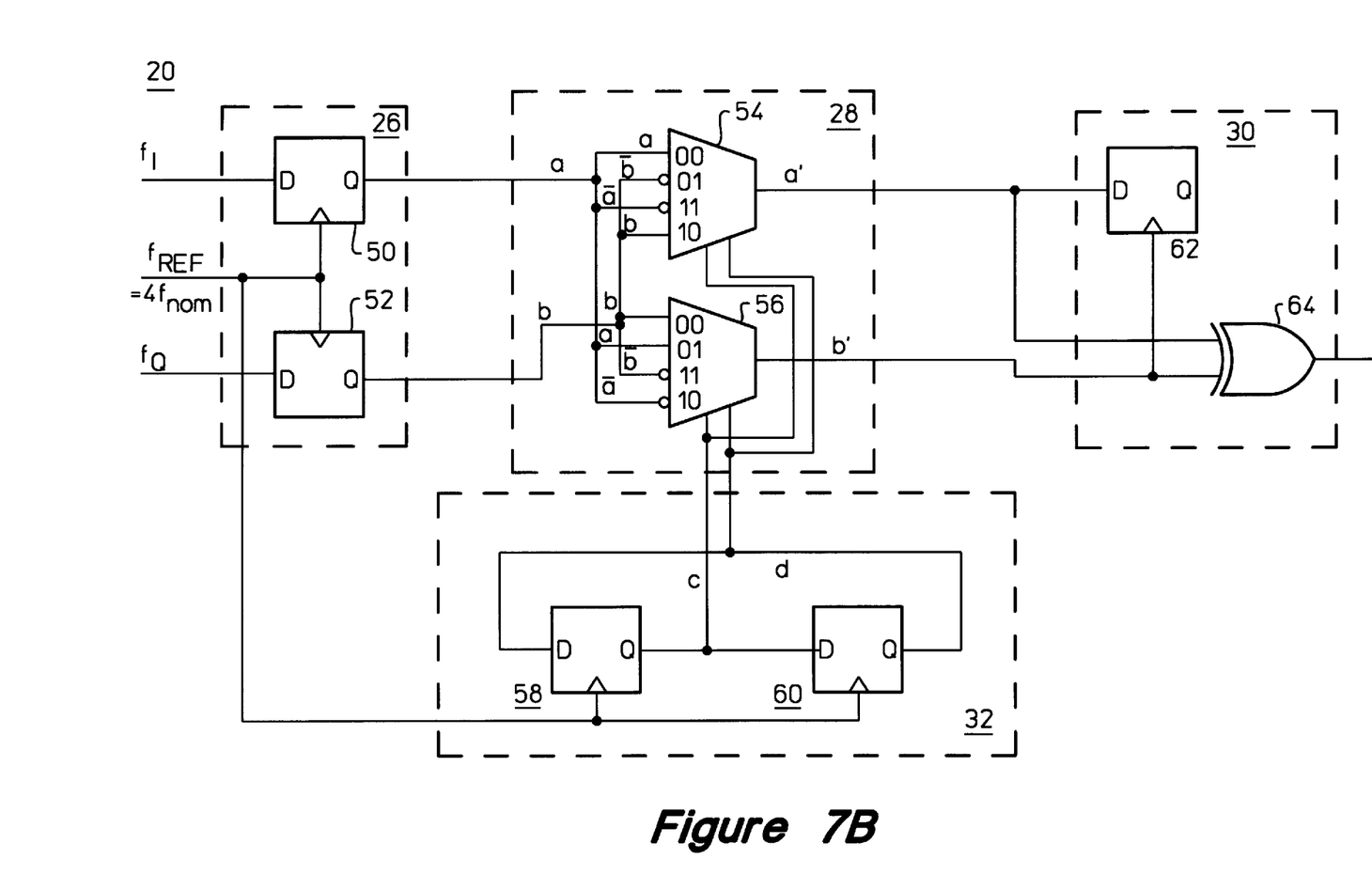
Figure 7C:
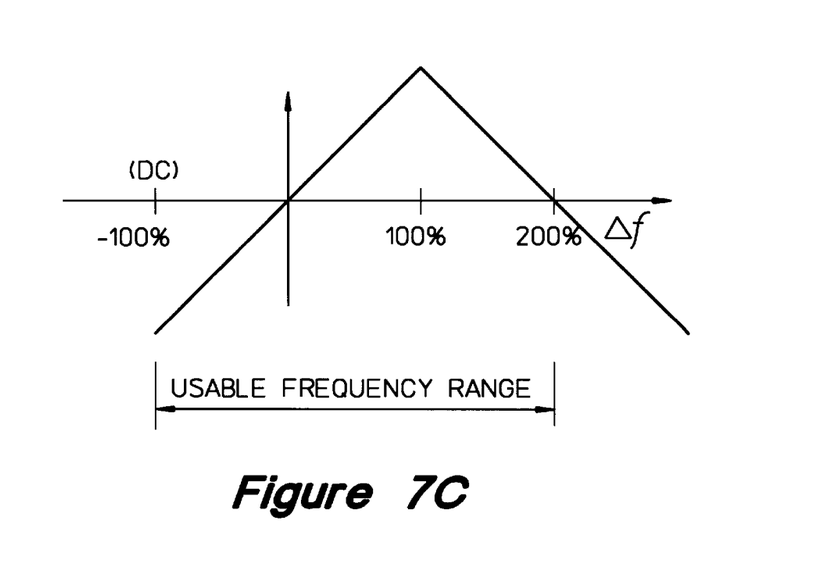

If the double-rate sampling still does not provide enough covering range, an alternate embodiment, a quad-rate sampling scheme (shown in FIGS. 7A–C), can be used. Without phase correction, the sampled vector rotates counter-clockwise 90° per sample, when the frequency is in proximity to its nominal rate. Phase correction rotates the sampled vector clockwise by 0°, 90°, 180° and 270° successively, and repeats. In the truth table, shown in FIG. 7A, the four states that correspond to the four different degrees of rotation are coded as 00, 01, 11 and 10. The function can be implemented with two selectors, i.e. two 4:1 multiplexors, shown in FIG. 7B. The phase-corrected vector provides the sense and magnitude of the frequency offset. The usable range is quadrupled to +/− 200%, or from DC to three times the nominal frequency. The beat frequency output vs. the frequency offset is shown in FIG. 7C.

Figure 8:
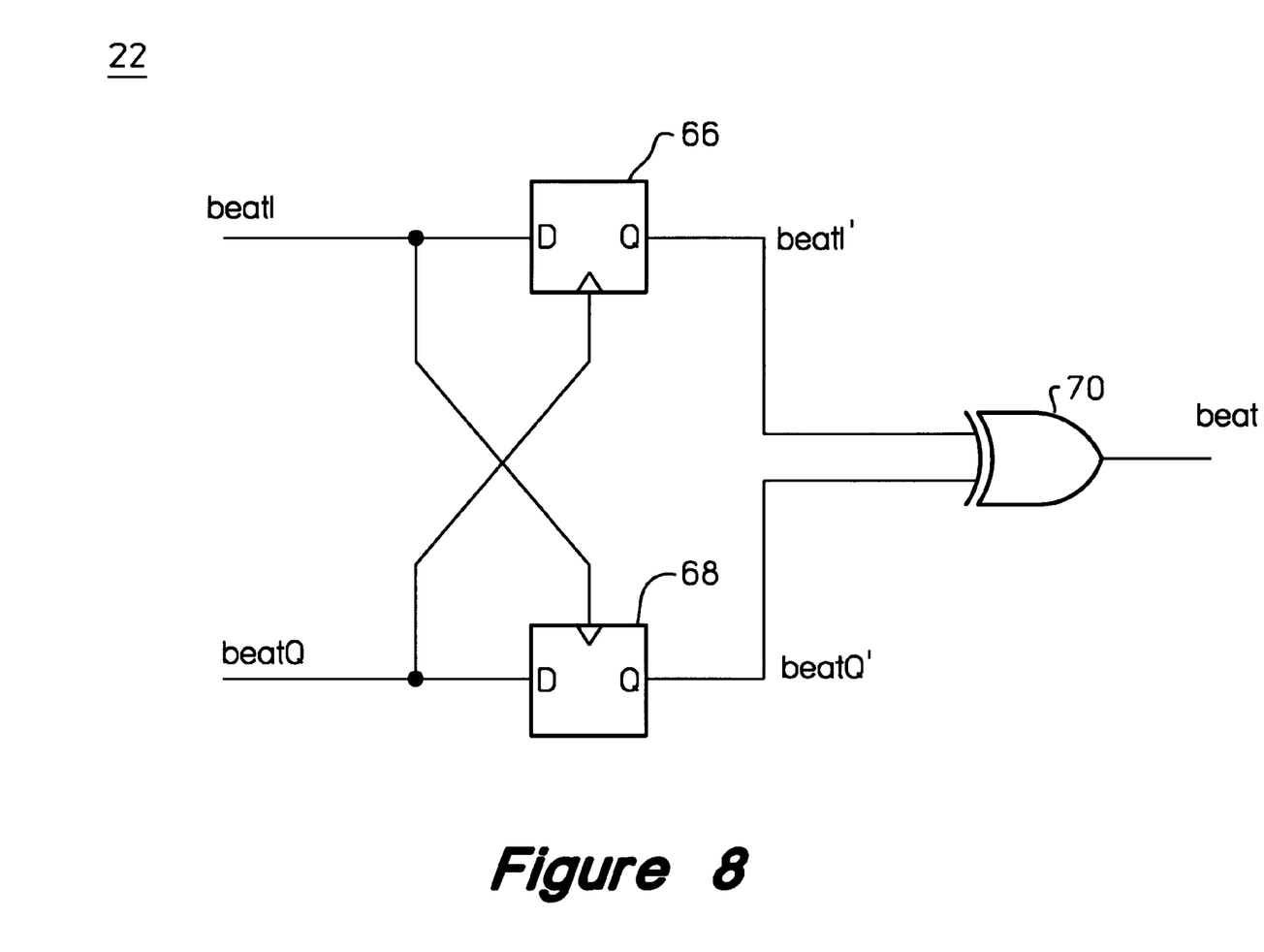
FIG. 8 illustrates the debouncer circuit shown in FIG. 2.

The debouncer circuit 22 is illustrated in FIG. 8. Signal beatI is the input to a first latch 66 and the clock input to a second latch 68. Signal beatQ is the input to the second latch 68 and the clock input to the first latch 66. The outputs of the first and second latches 66, 68, beat I' and beat Q', are debounced signals. They may be optionally combined with an XOR gate 70.

The debouncer circuit 22 takes care of the situations when the phase-corrected vector is not or barely rotating, which happen when the PLL is in-lock or very close to it. This vector may by chance lie near the border between two adjacent quadrants. Under this condition, spurious beat signals can be generated from jitter on the clocks, meta-stability of the flip-flops, power supply noise and other noise sources. Because only one bit of the vector is chattering while the other bit is decidedly static, cross coupling the two bits of this vector to the D and Q input of two D-latches eliminates chattering.

Figure 9:
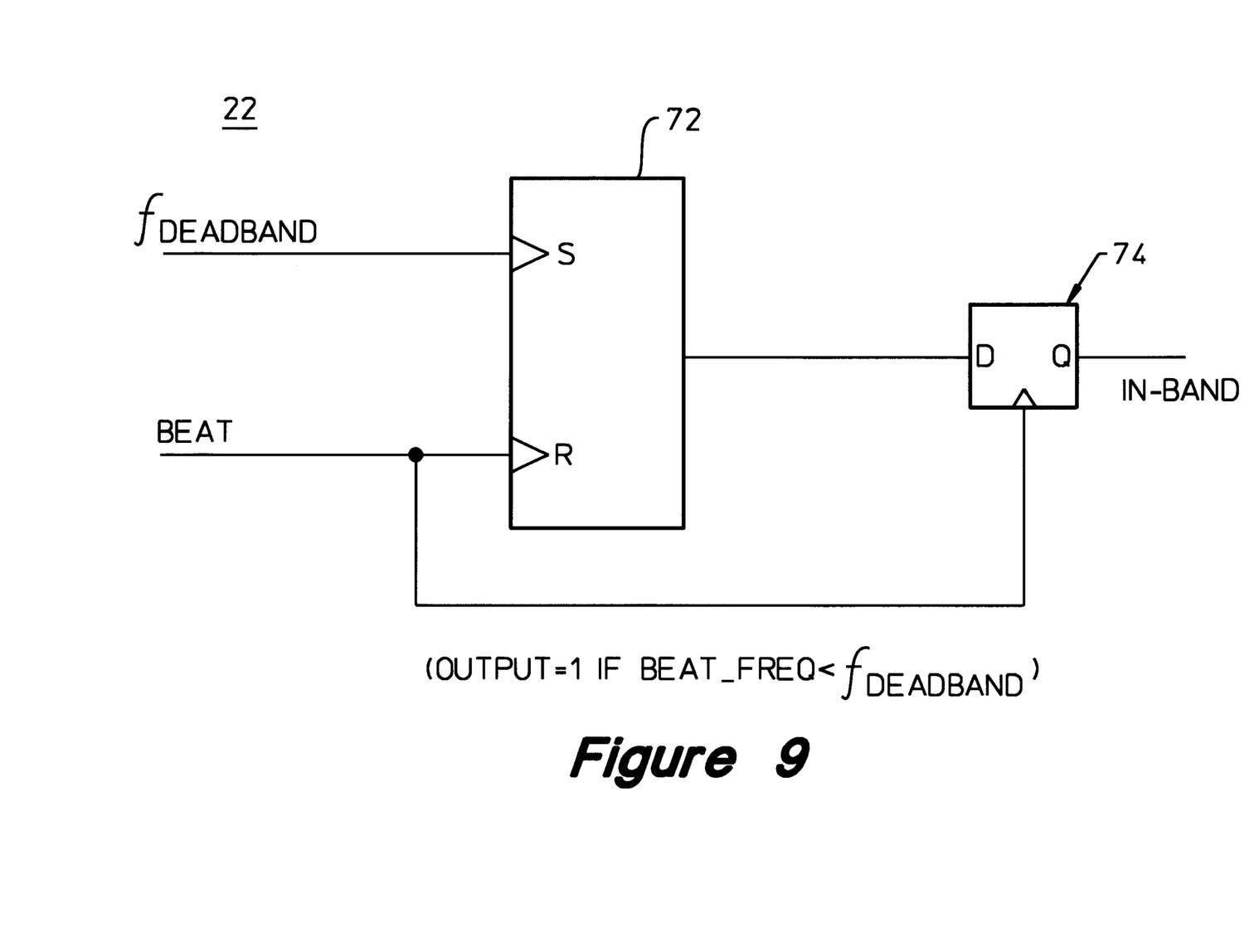
FIG. 9 illustrates the frequency comparator shown in FIG. 2.

FIG. 9 illustrates the frequency comparator 24 shown in FIG. 2. An edge-triggered S-R latch 72 receives the dead-band signal at the S-input and the beat signal at the R-input. The input of a D-flip-flop 74 is connected to the output of the S-R latch 72 and clocked by the beat signal. The output of the D-flip-flop 74 indicates that the beat signal is "in-band".

The frequency comparator 24 compares the beat frequency with that of a known (usually low) frequency $f_{deadband}$. If the beat frequency is lower, then the PLL is operating within the prescribed deadband. The main requirement of this frequency comparator 24 is that when the VCO is in-band, its output has to be static, free of any glitches whatsoever. This property can be easily verified by inspection: The in-band signal is clocked out by the beat signal. The beat signal also reset the S-R latch 72. If the beat signal is the one with lower frequency, then between two consecutive beat signal edges it is guaranteed to have at least one $f_{deadband}$ edge, which sets the S-R flip-flop 38. Therefore the output is always one. When out-of-band, it is acceptable to produce glitches and this design indeed does. The average output vs. frequency difference curve has been plotted in FIG. 3A. This output in conjunction with the up/down signal implements the desired overall frequency detector characteristics shown in FIG. 3B.

The present invention is an elegant design that uses standard digital cells. The design is robust because the frequency acquisition process is aided by a local reference clock. It is resistant to false lock, isolated bit-error events and jitter on the input data. This is a very important property for data communication applications, which are driven by cost and therefore usually do not have perfect signal qualities. Furthermore, this design has wide usable frequency range to cover the variations of an integrated VCO. The frequency of the VCO is not allowed to deviate from the deadband, no matter what signal is received at the data input, including no input, spurious input, or data at the wrong bit rate. This new design keeps the VCO approximately in frequency lock at all times, thereby greatly reducing phase acquisition time.

I claim:

1. A k-fold oversampling rotational frequency detector for receiving at least one phase of an input clock signal having a frequency $f_{nom}+\Delta f$ and a reference clock signal comprising:

a phase sampler, receiving the input and reference clock signals, being operative to generate a first phase signal indicative of the phase of the input clock signal on at least one edge of the reference clock signal, having a phase sampling rate $(k*f_{nom})$;

a phase correction generator, receiving the reference clock signal, being operative to generate a phase error signal, wherein the phase error for the nth sample is $\Phi_{error}(n)=2\pi n/k$, the phase error being due to the oversampling factor k>1;

a phase subtractor, receiving the first phase signal and the phase error signal, producing a phase difference signal indicative of the phase difference between the first phase signal and the phase error signal; and a rotation direction/frequency detector, receiving the phase difference signal, producing a sign output signal indicative of the sign of the Δf term of the input clock signal and a beat signal that toggles at a frequency proportional to Δf.

2. A rotational frequency detector, as defined in claim 1, wherein k=2, the input clock signal further comprising an in-phase clock signal and a quadrature phase clock signal.

3. A rotational frequency detector, as defined in claim 2, wherein:

the reference clock signal is a 50% duty-cycle square wave of frequency $(k*f_{nom}/2)$; and the phase samples are triggered by rising and falling edges of the reference clock signal to achieve the sampling rate $k*f_{nom}$.

4. A rotational frequency detector, as defined in claim 3, further comprising:

a first and a second latch, each latch receiving the in-phase clock signal on its data input, the first latch receiving an inverted reference signal at its clock input and the second latch receiving the reference signal at its clock input;

a third and a fourth latch, each latch receiving the quadrature phase clock signal, the third latch receiving an inverted reference signal at its clock input and the fourth latch receiving the reference signal at its clock input;

a first selector, having an inverted input receiving the output of the first latch and an input receiving the output of the second latch, having a control input that receives the reference signal, having an output, when the control input is HIGH the output of the second latch is selected, when the control input is LOW the output of the first latch is selected;

a second selector, having an inverted input receiving the output of the third latch and an input receiving the output of the fourth latch, having a control input that receives the reference signal, having an output, when the control input is HIGH the output of the fourth latch is selected, when the control input is LOW the output of the third latch is selected;

a flip-flop, connected to the outputs of the first and second selectors, being operative to produce the sign output signal; and an exclusive-OR gate, receiving the outputs of the first and second selectors, being operative to produce the beat signal.

5. A rotational frequency detector, as defined in claim 1, wherein k=4 and the input clock signal further comprising an in-phase clock signal and a quadrature phase clock signal.

6. A rotational frequency detector, as defined in claim 5, wherein:

the phase sampler includes,
  a first latch having an output, receiving the in-phase clock signal and the reference clock signal, and
  a second latch having an output, receiving the quadrature phase clock signal and the reference clock signal;

the phase correction generator includes,
  a third latch having an input and output, receiving the reference signal at a clock input,
  a fourth latch, having an inverted output connected to the input of the third latch and an input connected to the output of the third latch, receiving the reference clock signal at a clock input;

the phase subtractor includes two selectors, receiving the outputs of the first and second latches, having control lines connected to the output of the third latch and the inverted output of the fourth latch, the two selectors in combination produce the phase difference signal; and the rotation direction detector includes,
  a fifth latch, receives the phase difference signal from the two selectors, being operative to generate the sign output signal, and
  an exclusive-OR gate, receives the phase difference signal from the two selectors, being operative to generate the beat signal.

7. A frequency detector with a deadband, including the rotational frequency detector, as defined in claim 1, comprising:

a frequency comparator, receiving the beat signal and a signal at a deadband frequency corresponding to the width of the deadband; and a disabling means, connected to the rotational frequency detector and the frequency comparator, for disabling the sign output signal when the beat frequency is less than the deadband.

8. A phase lock loop, including the frequency detector as defined in claim 7, further comprising:

a phase detector having a first input, receiving a data signal on a second input;

an adder, receiving from the phase and frequency detectors;

a loop filter, receiving from the adder;

a voltage controlled oscillator, receiving from the loop filter, connected to the first input; and a divider, receiving from the voltage controlled oscillator, providing a signal to the frequency detector.

9. A frequency detector, as defined in claim 7, further comprising a debouncer circuit, receiving the beat signal, being operative to generate a stable beat signal.

10. A phase lock loop, including the frequency detector as defined in claim 9, further comprising:

a phase detector having a first input, receiving a data signal on a second input;

an adder, receiving from the phase and frequency detectors;

a loop filter, receiving from the adder;

a voltage controlled oscillator, receiving from the loop filter, connected to the first input; and a divider, receiving from the voltage controlled oscillator, providing a signal to the frequency detector.

* * * * *